United States Patent
Zhang et al.

(10) Patent No.: US 6,974,763 B1
(45) Date of Patent: Dec. 13, 2005

(54) METHOD OF FORMING SEMICONDUCTOR DEVICE BY CRYSTALLIZING AMORPHOUS SILICON AND FORMING CRYSTALLIZATION PROMOTING MATERIAL IN THE SAME CHAMBER

(75) Inventors: Hongyong Zhang, Kanagawa (JP); Hideki Uochi, Kanagawa (JP); Akira Miyanaga, Kanagawa (JP); Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 568 days.

(21) Appl. No.: 09/695,414

(22) Filed: Oct. 25, 2000

Related U.S. Application Data

(60) Division of application No. 08/685,789, filed on Jul. 24, 1996, now Pat. No. 6,156,627, which is a continuation of application No. 08/420,472, filed on Apr. 12, 1995, now abandoned.

(30) Foreign Application Priority Data

Apr. 13, 1994 (JP) .................................. 6-100641

(51) Int. Cl.$^7$ ............................................ H01L 21/00
(52) U.S. Cl. .................................................. 438/486
(58) Field of Search ............................... 438/149, 482, 438/484, 485, 486, 487

(56) References Cited

U.S. PATENT DOCUMENTS

| | | | |
|---|---|---|---|
| 2,414,406 A | * | 1/1947 | Colbert et al. ............... 118/730 |
| 2,450,850 A | * | 10/1948 | Colbert et al. ............... 427/166 |
| 3,617,373 A | * | 11/1971 | Mott ............................ 216/17 |
| 4,657,775 A | | 4/1987 | Shioiri et al. |
| 4,796,083 A | | 1/1989 | Cherukuvi et al. |
| 4,951,601 A | * | 8/1990 | Maydan et al. ............... 118/719 |
| 4,992,305 A | | 2/1991 | Erbil |
| 5,147,826 A | * | 9/1992 | Liu et al. |
| 5,264,383 A | | 11/1993 | Young ................... 437/40 TFT |
| 5,275,851 A | | 1/1994 | Fonash et al. ............... 437/233 |
| 5,352,291 A | | 10/1994 | Zhang et al. |
| 5,352,488 A | | 10/1994 | Spencer et al. |
| 5,352,631 A | | 10/1994 | Sitaram et al. |
| 5,403,772 A | | 4/1995 | Zhang et al. |
| 5,426,064 A | | 6/1995 | Zhang et al. ......... 437/40 TFT |
| 5,481,121 A | | 1/1996 | Zhang et al. |
| 5,488,000 A | | 1/1996 | Zhang et al. |

(Continued)

FOREIGN PATENT DOCUMENTS

EP 0 174 553 A2 3/1986

(Continued)

OTHER PUBLICATIONS

Maissel et al., Handbook of Thin Film Technology, McGraw-Hill Book Company, 1970, pp. 7-2 to 7-4.*

(Continued)

*Primary Examiner*—Evan Pert
(74) *Attorney, Agent, or Firm*—Eric J. Robinson; Robinson Intellectual Property Law Office, P.C.

(57) ABSTRACT

A substrate on which an amorphous silicon film is formed is placed in a vacuum chamber. An organic nickel vapor or gas is introduced into the chamber and then decomposed, so that a thin film containing nickel (a catalytic element which promotes crystallization of the amorphous silicon film) or a compound thereof is uniformly deposited on the amorphous silicon film. After that, the substrate is heated at a temperature such as 550° C. lower than a normal solid phase growth temperature for a short time such as 4 hours, to uniformly crystallize the amorphous silicon film. A crystalline silicon film is obtained by this crystallization process.

18 Claims, 5 Drawing Sheets

U.S. PATENT DOCUMENTS

| | | | |
|---|---|---|---|
| 5,512,320 A | * | 4/1996 | Turner et al. |
| 5,578,520 A | | 11/1996 | Zhang et al. |
| 5,654,203 A | | 8/1997 | Ohtani et al. |
| 5,808,321 A | | 9/1998 | Mitanaga et al. |
| 5,843,225 A | | 12/1998 | Takayama et al. |
| 5,861,337 A | | 1/1999 | Zhang et al. |
| 6,156,627 A | * | 12/2000 | Zhang et al. |
| 6,174,374 B1 | | 1/2001 | Zhang et al. |

FOREIGN PATENT DOCUMENTS

| | | | |
|---|---|---|---|
| JP | 61-63017 | 4/1986 | |
| JP | 61-070716 | 4/1986 | |
| JP | 63-155714 | 6/1988 | |
| JP | 2-140915 | 5/1990 | ........... 437/40 TFT |
| JP | 2-222546 | 9/1990 | |
| JP | 5-90518 | 4/1993 | |
| JP | 6-029212 | 2/1994 | |

OTHER PUBLICATIONS

F. Spaepen et al., Crucial Issues in Semic. Mat. & Proc. Technol., S. Coffa et al., eds, Metal-enhanced Growth of Si.

J.E. Greene et al., Thin Solid Films 34 (1976) 27, "Metal induced crystallization of R.F. sputtered a Si-films".

G. Radnoczi et al., J. Appl. Phys., 69(9) (1991) 6394, "Al induced crystallization of a Si".

A.V. Dvurechenskii et al., "Transport Phenomena in Amorphous Silicon Doped by Ion Implanataion of $3^{rd}$ Metals", Akademikian Lavrentec Propsekt 13, 630090 Novosibrisk 90, USSR, pp. 635-640.

T. Hempel, et al. Solid State Comm., 85,11(1993)921 "Needle-Like Crystallization of Ni Doped A-Si Thin Films".

J.R. Bosnell, et al., Thin Solid Films, 6(1970) 161 ". . . The Influence of Contact Materials or . . . Crystallization . . . ".

C. Hayzelden et al., Appl. Phys. Lett., 60,2(1992)225 ". . . TEM Studies of Silicide Mediated Crystallization . . . ".

Y.N. Efokhin, et al., Appl. Phys. Lett., 63,23(1993) 3173 ". . . NiSiz Formation . . . on Preamorphized Silicon . . . ".

T.T. Ngo, et al., Appl. Phys. Left. 66,15(1995) 1906-1908 ". . . Growth of Monodisperse Islands".

Y. Kawazu et al., Jpn. J. Appl. Phys., 29,12(1990)2698 ". . . Crystallization of A-Si:H Induced by Nickel . . . ".

D. Tonneau et al., J. de Physique, coll. C5, 5,50(1989)647 ". . . Metal Carbonyis for CVD of Microstrues".

S. Wolfe & R.N. Tavber, "Silicon Processing got the VLSI Era" vol. I, 1986, p. 51-3, 335.

ASM Handbook, vol. 5, p. 510-531 (1994).

* cited by examiner

METHOD OF FORMING SEMICONDUCTOR DEVICE BY CRYSTALLIZING AMORPHOUS SILICON AND FORMING CRYSTALLIZATION PROMOTING MATERIAL IN THE SAME CHAMBER

This application is a Divisional of application Ser. No. 08/685,789, filed Jul. 24, 1996 now U.S. Pat. No. 6,156,627; which it self is a Continuation of Ser. No. 08/420,472 filed Apr. 12, 1995 now abandoned.

BACKGROUND OF THE INVENTION

The present invention relates to a method for forming a semiconductor device having a crystalline silicon semiconductor film such as a polycrystalline silicon film, a single crystalline silicon film and a microcrystalline silicon film. The crystalline silicon film formed by the present invention is used in various semiconductor devices.

A thin film transistor (TFT) using a thin film semiconductor is well known and constructed by forming a thin film semiconductor, particularly a silicon semiconductor film. The TFT is used in various integrated circuits and attracted as, in particular, a switching element provided with each pixel and as a driver element formed in a peripheral circuit portion in an active matrix type liquid crystal display device.

As a silicon film used in a TFT, it is convenient to use an amorphous silicon film. However, there is a problem that an electrical characteristic of the amorphous silicon film is very low than that of a single crystalline semiconductor used in a semiconductor integrated circuit. Therefore, the amorphous silicon film is used in only limited use such as a switching element in an active matrix circuit. To improve a characteristic of a TFT, a crystalline silicon film may be used. The crystalline silicon film other than a single crystalline silicon is called a polycrystalline silicon (poly-silicon) film, a microcrystalline silicon film or the like. To obtain such crystalline silicon film, an amorphous silicon film may be formed and then crystallized by heating (thermal annealing). This is called a solid phase growth method because an amorphous state is changed into a crystalline state while maintaining a solid state.

Since a solid phase growth for silicon needs a heating temperature of 600° C. or higher and 10 hours or longer, it is difficult to use an inexpensive glass substrate as a substrate. Since, for example, a Corning 7059 glass used in an active matrix type liquid crystal display device has a glass warp point (glass transition temperature) of 593° C., when a large size substrate is used, a thermal annealing with 600° C. or higher produces a problem.

To contrast this, according to research of the inventors, the following has confirmed. That is, an extremely small quantity of elements such as nickel, palladium, lead or the like is deposited on a surface of an amorphous silicon film and then heated, so that crystallization can be performed at 550° C. for about 4 hours.

To introduce an extremely small quantity of elements (a catalytic element which promotes crystallization) as described above, a film containing the catalytic element or a compound thereof may be deposited by sputtering. However, if a semiconductor includes a large quantity of elements as described above, reliability and electrical stability of a device using such semiconductor is deteriorated. When a film is formed by sputtering, it is difficult to accurately adjust a quantity, that is, a thickness of the film. Also, it is further difficult to form a film having a uniform thickness on a substrate. Therefore, variations in a characteristic of a semiconductor device to be obtained produce.

Also, When a film is formed by sputtering, since an amorphous silicon film is damaged largely by shock in sputtering, a characteristic of a semiconductor device is not always preferred.

There is a method for forming a film by, for example, a spin coating, in stead of sputtering. However, it is difficult to obtain a film having a uniform thickness by the spin coating. For example, in a rectangular substrate used in a liquid crystal display device, a solution concentrates easily on corners of the substrate, so that a film thickness is nonuniform. Also, when a film containing a catalytic element compound is formed by drying a solvent, a film thickness is nonuniform by nonuniformity of drying and generation of crystal nucleus, so that it causes variations of semiconductor devices.

SUMMARY OF THE INVENTION

The object of the present invention is (1) to adjust a quantity of catalytic elements, (2) to uniformly introduce a catalytic element and (3) to improve productivity when introducing a catalytic element, in forming a crystalline thin film silicon semiconductor by thermal processing at a low temperature than a temperature required for a general solid phase growth method using a catalytic element.

To achieve the above object, in the present invention, a film including a catalytic element or a compound thereof is deposited on a surface of an amorphous silicon film by decomposing an organic metallic vapor or gas having a catalytic element using an energy (such as heat, light and the like) to be supplied.

The above processing has basic advantages as described below.

(a) A concentration of a catalytic element in an atmosphere can be adjusted accurately by a vapor pressure and the like. Further, if introduction of the catalytic element to the atmosphere is stopped, the film including the catalytic element is not further formed on an amorphous silicon film.

(b) In decomposition and deposition processing by external energy application, an extremely uniform film is formed on a surface of an amorphous silicon film, and the amorphous silicon film is not damaged.

(c) If the deposition processing of the film including the catalytic element or a compound thereof is performed by decomposition with external energy application and then heat processing is performed immediately, a solid phase growth is sequentially produced, so that it provides improvement of productivity.

In the present invention, when nickel is used as a catalytic element, Bis-cyclopemtadienyl-nickel (($NiC_5H_5)_2$) (referred to as BCP nickel or BCP salt), Bis-methylcyclopentadienyl-nickel ($Ni(CH_3C_5H_4)_2$ (referred to as BMCP nickel or BMCP salt), Bis-2,2,6,6-tetramethyl-3,5-hptanediono nickel ($Ni(C_{11}H_{19}O_2)_2$) may be used.

In BCP nickel, a melting point is 173 to 174° C., vapor pressures at 90° C. and 130° C. are 0.04 torr and 0.6 torr, respectively. In BMCP nickel, a melting point is 34° C., and vapor pressures at 90° C. and 130° C. are 1.6 torr and 15 torr, respectively.

A film obtained by decomposing these organic metals may be deposited directly on a region of an amorphous silicon film into which a catalytic element is introduced, or on a thin oxide film which has a thickness of 100 Å or less and is formed on the amorphous silicon film.

Also, a crystal growth can be selectively produced by depositing a film including a catalytic element or a compound thereof. For example, a mask film is selectively formed and then a desired portion on a surface of an amorphous silicon film is exposed substantially. Although a thickness required for the mask film depends on the quality of a material of the mask film, when the mask film is a silicon oxide, a sufficient thickness of the mask film is 500 Å. By depositing a film including an catalytic element according to the present invention, the catalytic element is introduced into only desired portion of an amorphous silicon film.

Crystals can be grown in a direction parallel to a surface of a silicon film, from a region on which a film including a catalytic element or a compound thereof is deposited, toward a region into which the film is not deposited. The region which crystals are grown in a direction parallel to a surface of a silicon film is referred to hereinafter as a region crystal-grown in a transverse direction.

In the region crystal-grown in a transverse direction, it is confirmed that a concentration of a catalytic element is low. Although it is effective to use a crystalline silicon film as an active layer region of a semiconductor device, it is further preferred that a concentration of an impurity in the active layer region is generally low. Therefore, it is useful in a device fabrication to form an active layer region of a semiconductor device using the region crystal-grown in a transverse direction. However, a photolithography process must be performed before a film including a catalytic element is selectively deposited, and further a heating process must be performed before the photolithography process, so that it is possible to produce, for example, contraction of a substrate. As a result, it is necessary to consider such problem in selecting a crystal growth with a transverse direction.

The present invention is performed by the following processes in general.

(1) A substrate is placed in a chamber and then heated at a desired temperature.

(2) A vapor or gas of an organic metal including an catalytic element which promotes crystallization of an amorphous silicon film is introduced in the chamber.

(3) The introduced vapor or gas is decomposed by providing (applying) heat, light or plasma, so that a film including the catalytic element or a compound thereof is deposited on a surface of the substrate.

(4) The amorphous silicon film is crystallized by a heating process.

In the process (2), not only the vapor or gas of the organic metal is introduced continuously in the chamber but also may be introduced with only a desired quantity, for example, 1 sccm. A pressure in this atmosphere may be a low pressure or an atmosphere pressure. In a low pressure, a low pressure chemical vapor deposition (LPCVD) apparatus may be used. In an atmosphere pressure, an atmosphere pressure CVD (APCVD) apparatus can be used.

It is useful that, during or after the precess (3), the catalytic element is reacted with an amorphous silicon in an interface between the deposited film and the amorphous silicon film, to produce a reaction product. By preproducing the reaction product, crystallization in a later thermal crystallization process can be performed easily. Although this reason is not clear, it can be considered that the reaction product operates as a crystal nucleus.

The precess (4) may be performed in another thermal annealing apparatus after the substrate having an amorphous silicon film is taken out from the chamber, or may be performed continuously in the chamber without taking out the substrate.

After the process (4), when an intense light such as a laser is irradiated to the silicon film, a portion of the silicon film which is not completely crystallized by a solid phase growth can be crystallized, so that a crystalline silicon film having further superior characteristics can be obtained. With respect to a laser to be used, Various excimer lasers are utilized easily.

If a catalytic element is stored in a chamber in which a film including an catalytic element or a compound thereof is deposited, the catalytic element is introduced excessively into a silicon film. Therefore, it is desired to wash (clean) the chamber frequently. Cleaning by plasma or the like may be performed when the chamber is used.

In the present invention, when nickel is used as a catalytic element, a remarkable effect can be obtained. Also, Pd, Pt, Cu, Ag, Au, In, Sn, P, As and Sb can be used as a catalytic element. Further, at least one element selected from VIII group element, IIIb group element, IVb group element and Vb group element can be used.

DETAILED DESCRIPTION OF THE PREFERRED EMBODIMENTS

Embodiment 1

The embodiment shows a method for forming a silicon film having crystalline on a glass substrate. Referring to FIGS. 1A to 1E, a process will be described until introduction of a catalytic element (nickel in the embodiment) and crystallization. A substrate is a Corning 7059 glass having a size of 100 mm×100 mm.

Figure 1A:
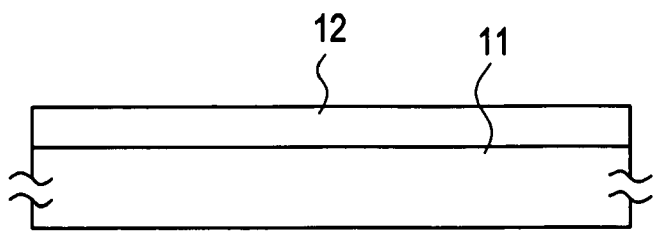
FIGS. 1A to 1E show a forming process of an embodiment according to the present invention.

A silicon oxide film 12 having a thickness of 1000 to 5000 Å, for example, 2000 Å, is formed on a substrate 11 by sputtering and plasma chemical vapor deposition (plasma CVD). (FIG. 1A)

Figure 1B:
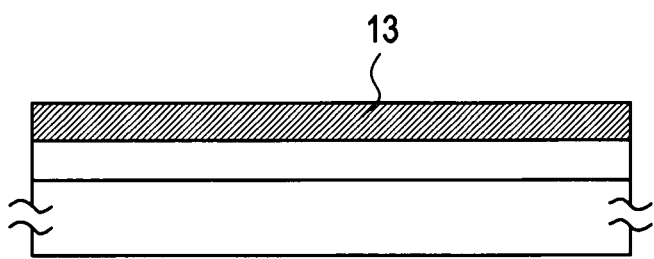

An amorphous silicon film 13 having a thickness of 100 to 1500 Å is formed by plasma CVD and low pressure CVD (LPCVD). In the embodiment, the amorphous silicon film 13 having a thickness of 500 Å is formed by plasma CVD. (FIG. 1B)

Figure 1C:
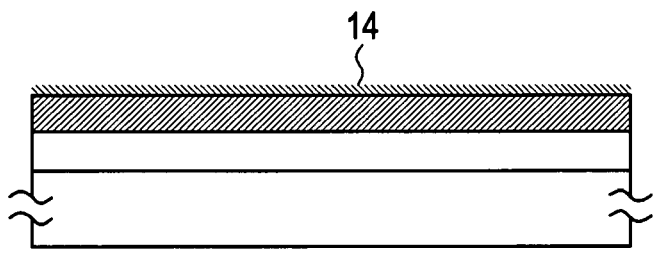
Figure 1D:
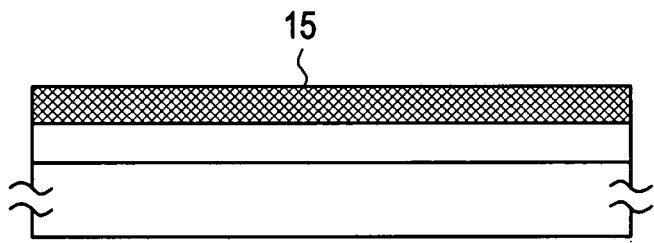
Figure 1E:
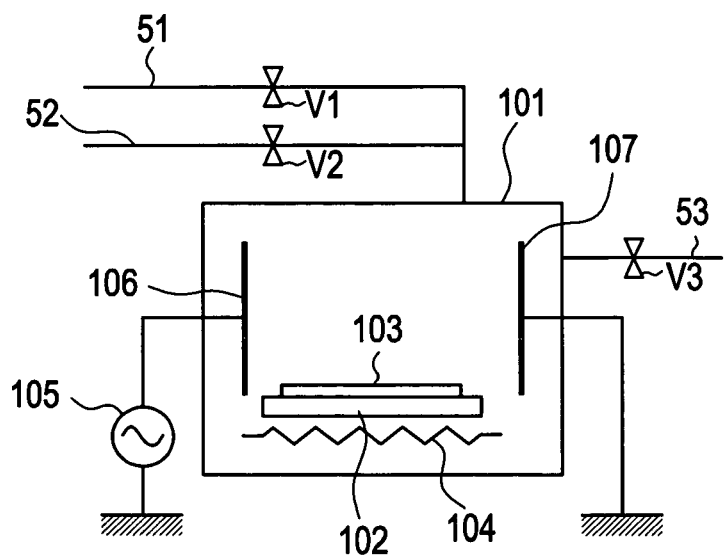

Fluorinating is performed to remove dirt and a natural oxide film, and then the substrate 11 is placed in a chamber 101 as shown in FIG. 1E. An introducing tube for introducing a gas from an external and an exhaust tube 53 are connected to the chamber 101. The introducing tube has two gas systems 51 and 52. A first gas system 51 is used to introduce an organic nickel gas/vapor. A second gas system 52 is used to introduce a carrier gas for the organic nickel gas/vapor. In the first gas system 51, the organic nickel gas/vapor (for example, BMCP nickel as described above) generated by a vaporizer (not shown) is carried by a desired gas (for example, argon or hydrogen). In this state, in order not to coagulate an organic nickel in the introducing tube, it is necessary to maintain the introducing tube at a desired temperature, preferably, at a temperature of a vaporizer or higher.

It is difficult to control a concentration of an organic nickel gas/vapor obtained from the first gas system 51. This is because a vapor pressure depends on a temperature of a vaporizer and the concentration is changed largely by slight temperature variation. Therefore, a carrier gas (for example, argon or hydrogen) is introduced from the second gas system 52 to dilute an organic nickel gas/vapor. A concentration ratio is controlled by valves V1 and V2.

As a result, an organic nickel gas or vapor is introduced into the chamber 101.

Parallel plate type electrodes 106 and 107 are arranged in the chamber 101. A radio frequency (RF) power source 105 is arranged outside the chamber 101 and used to remove nickel which remains in the chamber 101 by producing plasma between the electrodes 106 and 107.

The chamber 101 also includes a heater 104 and a susceptor 102 on which an object 103 (for example, the substrate 11) to be processed is placed. It is desired to maintain the whole chamber 101 at a temperature which an organic nickel is not coagulated. It is required that the substrate 11 is heated at a higher temperature than the temperature which an organic nickel is not coagulated and maintained at a temperature which the organic nickel is thermally decomposed.

A method for depositing a nickel film using the chamber as described above will be described below.

The substrate 11 is placed into the chamber 101. A valve V3 is opened while the valves V1 and V2 are closed, so that exhaust is performed until a pressure of the chamber 101 reaches a desired pressure. Since high vacuum state is not necessary in this process, exhaust at 1 to 500 mtorr is sufficient.

By supplying a current to the heater 104, the substrate 11 is heated at 500 to 550° C. In this state, the valve V3 is closed and the valves V1 and V2 are opened to introduce an organic nickel gas. After the organic nickel gas having a desired quantity is introduced, the valves V1 and V2 are closed. As a result, the organic nickel gas and a carrier gas are confined in the chamber 101 and the organic nickel gas is thermally decomposed on the substrate 11, so that a nickel compound film 14 is formed on a surface of the substrate 11. (FIG. 1C)

After that, a solid phase growth process is performed. there may be two methods in the solid phase growth process.

In a first method, the substrate is taken out from the chamber to an external and then a solid phase growth process is performed. The heater 104 is turned off to cool the substrate and then a gas in the chamber is exchanged completely into a harmless gas to a human by opening the valves V2 and V3. The valve V3 is closed and then the chamber is opened to an atmosphere to take out the substrate. Further a conventional solid phase growth process is performed. After the substrate is taken out, the chamber is maintained at a desired pressure and then cleaning of the chamber may be performed by producing discharge between the electrodes 106 and 107.

In a second method, a solid phase growth process is performed by heating the substrate in the chamber. The valves V2 and V3 are opened, so that an organic nickel gas is removed completely from the chamber. This is because, if the organic nickel gas remains in the chamber, nickel is introduced continuously in a solid phase growth process and therefore a concentration of nickel in a silicon film is increased excessively. It is desired to introduce an inert gas such as argon or nitrogen in the chamber.

A heater is set to heat a substrate at 500 to 580° C., for example, 550° C., so that a solid phase growth proceeds by maintaining this state. After a desired time, for example, 4 hours elapses, the valve V3 is closed and then the heater is turned off to cool the substrate. After the substrate is cooled, it is taken out to an external. As a result, a crystallized silicon film 15 can be obtained. The above heating process may be performed at 450° C. or higher. However, when a temperature is low, a heating time becomes long, thereby to decrease production efficiency. Also, when a temperature is 580° C. or higher, there is a problem with respect to heat resistance of a glass substrate used as a substrate. A thermal annealing temperature must be determined in accordance with productivity and the heat resistance of the substrate. (FIG. 1D)

In the embodiment, a pressure in an organic nickel decomposition and deposition process may be a low pressure or an atmosphere pressure. This is because a quantity of nickel to be deposited is not determined by the pressure but is determined by a partial pressure. For example, a quantity of nickel in an atmosphere pressure can be almost equalled to that in a low pressure by increasing a dilution ratio using a carrier gas. Also, in an atmosphere pressure, the frequency of chamber cleaning can be decreased by depositing the nickel film while supplying (spraying) form a nozzle, as similar to APCVD.

Embodiment 2

In the embodiment, an apparatus as similar to EMBODIMENT 1 is used, and an organic nickel is decomposed by plasma instead of heat. Referring to FIGS. 1A to 1E, a process will be described until introduction of a catalytic element (nickel in the embodiment) and crystallization. A substrate is a Corning 7059 glass having a size of 100 mm×100 mm.

A process is performed as similar to EMBODIMENT 1 until the amorphous silicon film 13 formed on the substrate 11 is placed in the chamber 101 after a natural oxide film is removed.

After the substrate 11 is placed in the chamber 101, an organic nickel is introduced as similar to EMBODIMENT 1. Since the object of the embodiment is to decompose an organic nickel by using plasma, it is necessary to set a low pressure in the chamber 101. It is desired that the pressure is about 1 to 1000 Pa. In the embodiment, the pressure is adjusted to 20 Pa.

As described above, in EMBODIMENT 1, the parallel plate type electrodes 106 and 107 are arranged in the chamber 101 and the RF power source 105 is arranged outside the chamber 101, to perform cleaning of the chamber. However, in the embodiment (EMBODIMENT 2), these units are used to decompose an organic nickel.

As similar to EMBODIMENT 1, the chamber 101 also includes the heater 104 and the susceptor 102 on which the object 103 to be processed is placed. It is desired to maintain the whole chamber 101 at a temperature which an organic nickel is not coagulated. The substrate 11 is also maintained at a temperature which the organic nickel is not coagulated. This is because decomposition by only plasma without thermal decomposition is performed.

A method for depositing a nickel film using the chamber as described above will be described below.

The substrate 11 is placed into the chamber 101. The valve V3 is opened while the valves V1 and V2 are closed, so that exhaust is performed until a pressure of the chamber 101 reaches a desired pressure. Although a high vacuum state in this process of EMBODIMENT 1 is not necessary, in the embodiment, it is desired to obtain a high vacuum state having a desired pressure.

In this state, the valve V3 is closed and the valves V1 and V2 are opened to introduce an organic nickel gas. In the embodiment, a gas is always introduced, that is, a gas flow state is maintained, and a pressure is adjusted to 20 Pa by controlling a conductance of an exhaust system. Then, a high frequency energy (voltage) having an RF region (band) is supplied to the electrodes to produce plasma, so that an organic nickel is decomposed and then deposited on the substrate. A high frequency output is 20 W, and a film formation time is 2 minutes. (FIG. 1C)

After that, a solid phase growth process is performed. In the embodiment, since a substrate temperature for a solid phase growth process is different from that for thermal crystallization process largely, it is not desired in throughput that these processes are performed in the same chamber. Therefore, after a substrate is taken out, a solid phase growth process is performed. The heater 104 is turned off to cool the substrate and then a gas in the chamber is exchanged completely into a harmless gas to a human by opening the valves V2 and V3. The valve V3 is closed and then the chamber is opened to an atmosphere to take out the substrate. Further a conventional solid phase growth process is performed. After the substrate is taken out, the chamber is maintained at a desired pressure and then cleaning of the chamber may be performed by producing discharge between the electrodes 106 and 107. It is further desired that a multichamber system having a load chamber and an unload chamber is used instead of the chamber 101, so that further throughput can be improved.

As a result, the crystallized silicon film 15 can be obtained. The above heating process can be performed at 450° C. or higher. However, when a temperature is low, a heating time becomes long, thereby to decrease production efficiency. Also, when a temperature is 580° C. or higher, there is a problem with respect to heat resistance of a glass substrate used as a substrate. A thermal annealing temperature must be determined in accordance with productivity and the heat resistance of the substrate. (FIG. 1D)

Embodiment 3

In the embodiment, after a nickel film is formed on a surface of an amorphous silicon film by a method as shown in EMBODIMENT 2, a nickel silicide is formed on the surface and then thermal crystallization is performed. A process until an organic nickel is decomposed and deposited by RF plasma is performed as similar to EMBODIMENT 2.

To exhaust (remove) a remaining gas from the chamber, the valve V3 is opened, so that an organic nickel is exhausted completely. After that, only carrier gas is introduced by opening V2. A pressure is desired to be about 1 to 1000 Pa which is almost equal to a pressure when the organic nickel is decomposed. In the embodiment, the pressure is 25 Pa.

In the chamber including only carrier gas, an RF energy is applied to the electrodes 106 and 106 to produce plasma. By processing an amorphous silicon film on which a nickel film is deposited, using the plasma, a nickel silicide is formed by nickel and amorphous silicon. This is due to an energy of ion or radical to be accelerated. To effectively obtain this, it is desired that acceleration is increased by applying a bias to a substrate or that a direct current bias is applied to electrodes as parallel plate type plasma. An introduced carrier gas is Ar or Xe in which an effect is large. In particular, Xe is desired.

A case wherein a silicide is formed in this process is compared with a case wherein the silicide is not formed as shown in EMBODIMENT 2. As a result, it is observed using an electron microscope that a nucleus producing density is increased by forming the silicide in a thermal crystallization process.

Embodiment 4

Figure 5:
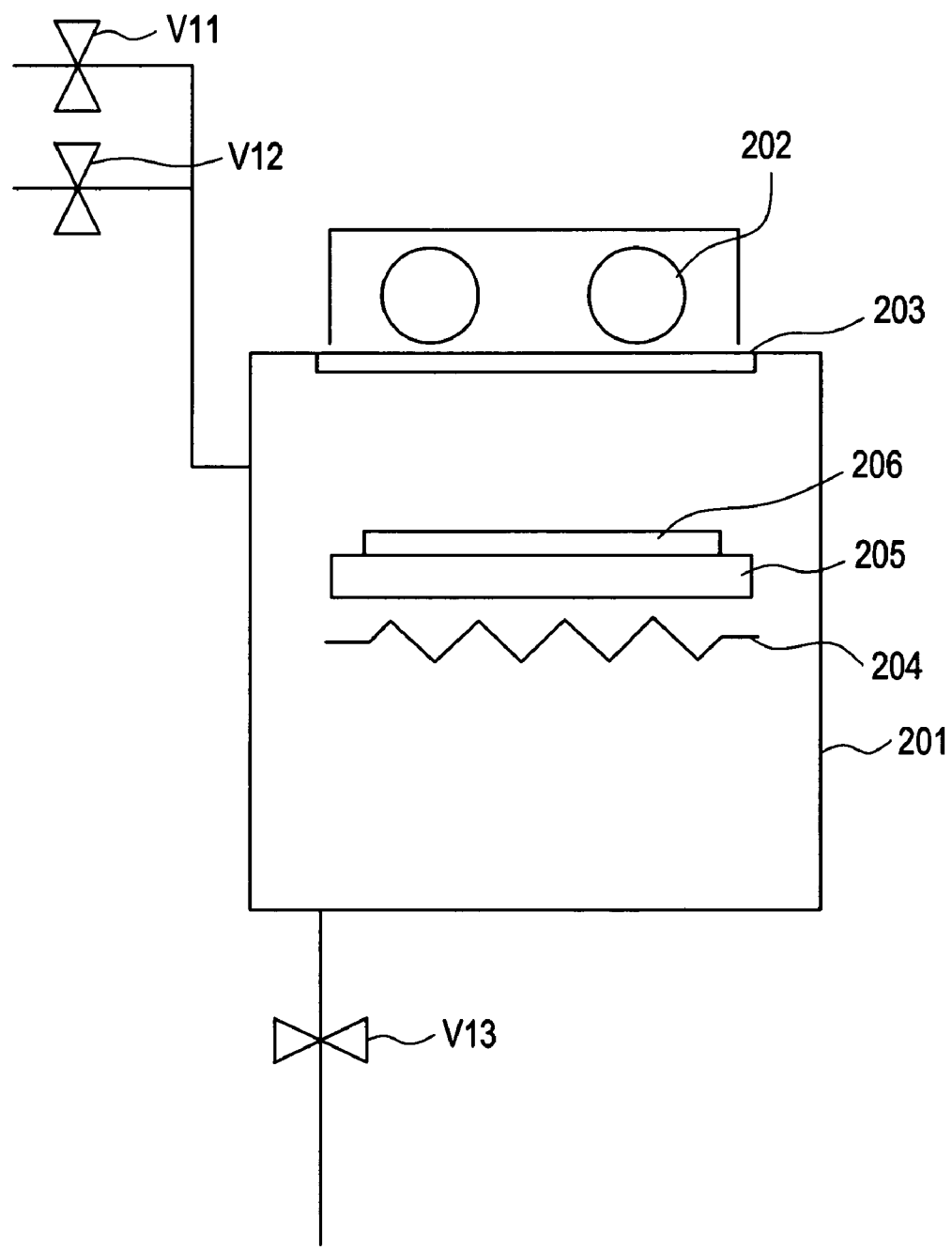
FIG. 5 shows a chamber of another embodiment.

In the embodiment, an organic nickel is decomposed and deposited by a ultraviolet light, and then a silicon film having crystalline is formed on a glass substrate. Referring to FIG. 5, a process until introduction of a catalytic element (nickel) and crystallization process will be described below. In the embodiment, A process until a substrate is placed in a chamber is performed as similar to EMBODIMENT 1.

A chamber 201 will be described below. An introducing tube for introducing a gas from an external and an exhaust tube are connected to the chamber 201. The introducing tube has two gas systems. A first gas system is used to introduce an organic nickel gas/vapor. A second gas system is used to introduce a carrier gas for the organic nickel gas/vapor. In the first gas system, the organic nickel gas/vapor (for example, BMCP nickel as described above) generated by a vaporizer is carried by a desired gas (for example, argon or hydrogen). In this state, in order not to coagulate an organic nickel in the introducing tube, it is necessary to maintain the introducing tube at a desired temperature, preferably, at a temperature of a vaporizer or higher. This structure is the same as that of FIG. 1E.

It is difficult to adjust a concentration of an organic nickel gas/vapor obtained from the first gas system. This is because a vapor pressure depends on a temperature of a vaporizer and the concentration is changed largely by slight temperature variation. Therefore, a carrier gas (for example, argon or hydrogen) is introduced from the second gas system to dilute the organic nickel gas/vapor. A concentration ratio is adjusted by valves V11 and V12.

As a result, an organic nickel gas or vapor is introduced into the chamber 201.

A low pressure mercury lump 202 is arranged on the chamber 201 through a quartz window 203. The chamber 201 also includes a heater 204 and a susceptor 205 on which an object 206 (for example, a substrate) to be processed is placed. It is desired to maintain the whole chamber 201 at a temperature which an organic nickel is not coagulated. The substrate is heated to control a reaction between deposited nickel and amorphous silicon in a surface of an amorphous silicon film. A reaction between the deposited nickel and the amorphous silicon can be prevented by maintaining a substrate temperature at a room temperature or less. This can be structured because of light reaction in which ion damage or heating is not a necessary condition.

A method for depositing a nickel film using the chamber will be described below.

The substrate is placed into the chamber 201. A valve V13 is opened while the valves V11 and V12 are closed, so that exhaust is performed until a pressure of the chamber 201 reaches a desired pressure.

In this state, the valve V13 is closed and the valves V11 and V12 are opened to introduce an organic nickel gas. After the organic nickel gas having a desired quantity is introduced, the valves V11 and V12 are closed. As a result, the organic nickel gas and a carrier gas are confined in the chamber 201. After that, an organic nickel is decomposed by turning on the low pressure mercury lamp 202, so that a thin film obtained by decomposing the organic nickel is deposited on a substrate. Generally, a photo-CVD has a defect that a deposition rate is low. However, in the present invention, since it is necessary to adjust a very small quantity of metals to be deposited, it is convenience. (FIG. 1C)

After the substrate is taken out from the chamber, a solid phase growth process is performed. In comparison with EMBODIMENTs 1 TO 3, an interface damage is small in the present embodiment, so that a crystalline silicon film having a high quality can be obtained.

Embodiment 5

In the embodiment, using a forming method of EMBODIMENT 1, a silicon oxide film having a thickness of 1200 Å is selectively formed, nickel is selectively introduced using the silicon oxide film as a mask, and then a solid phase growth process is performed for crystallization with a transverse direction. FIGS. 2A to 2E show a forming process of the embodiment.

Figure 2A:
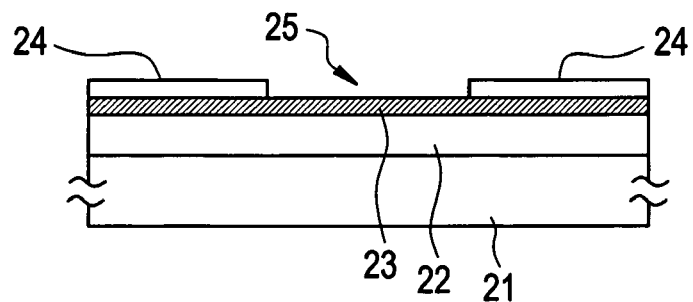
FIGS. 2A to 2E show a forming process of another embodiment.

A silicon oxide film 22 having a thickness of 1000 to 5000 Å is formed on a glass substrate (Corning 7059, 10 cm×10 cm in size) 21. Also, an amorphous silicon film 23 having a thickness of 500 to 1000 Å is formed by plasma CVD or LPCVD. Further, a silicon oxide film 24 having a thickness of 1000 Å or more, 1200 Å in the embodiment, is formed as a mask film by sputtering. Even if a film thickness of the silicon oxide film 24 is 500 Å, it is confirmed that no problem produces in an experiment of the inventors. However, in order to prevent introduction of nickel to an unnecessary portion by a pin hole or the like, a margin is provided. (FIG. 2A)

Figure 2B:
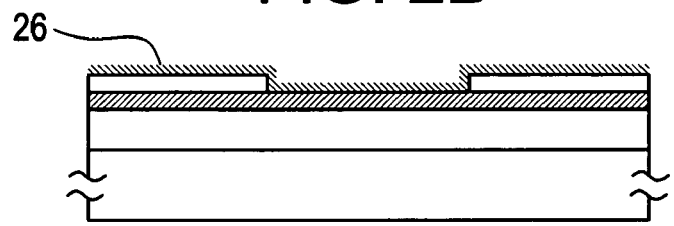

The silicon oxide film 24 is patterned at a desired pattern by a normal photolithography patterning process, to form a window 25 for nickel introduction. Such processed substrate is placed in the chamber 101, as similar to EMBODIMENT 1, and then a nickel compound film 26 having a desired thickness is deposited on a surface of the substrate using an organic nickel gas. (FIG. 2B)

Figure 2C:
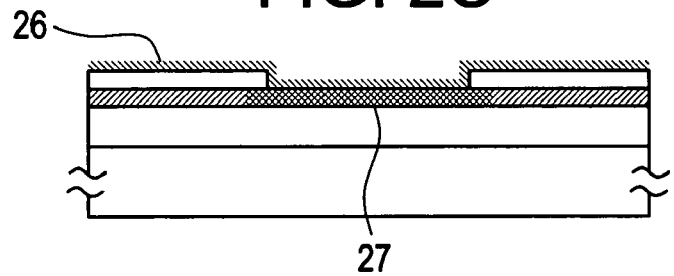

By a heating process at 550° C. (nitrogen atmosphere) for 8 hours, the amorphous silicon film 23 is crystallized. Crystallization is started from a region 27 in which the nickel compound film 26 is in contact with (or adheres to) the amorphous silicon film 23. (FIG. 2C)

Figure 2D:
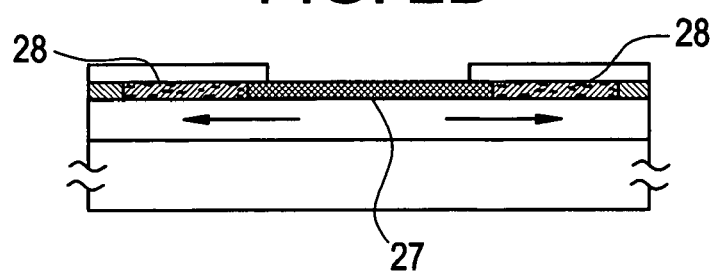

Crystallization proceeds to a surrounding region, as shown in arrows, so that a region 28 covered with the mask film 24 is also crystallized. (FIG. 2D)

Figure 2E:
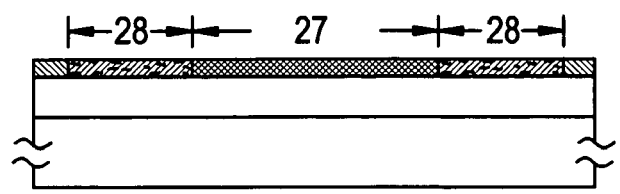

As described above, crystallization of the amorphous silicon film is performed. As shown in FIG. 2E, when crystallization with a transverse direction is performed, three regions each having different characteristics may be obtained.

A first region is a region 27 in which a nickel compound film is in contact with an amorphous silicon film. The region 27 is crystallized in a first stage of a thermal annealing process, and referred to as a longitudinal growth region. In the region 27, a nickel concentration is relatively high and crystallization is not aligned at a desired direction. As a result, since crystallinity of silicon is not superior so much, an etching rate to an acid such as hydrofluoric acid is relatively large.

A second region is a region 28 in which crystallization with a transverse direction is performed, and referred to as a transverse growth region. Crystallization in the region 28 is aligned at a desired direction and a nickel concentration is relatively low, so that it is preferred to use the region 28 in a device.

A third region is an amorphous region in which crystallization with a transverse direction is not performed.

Embodiment 6

In the embodiment, a thin film transistor (TFT) is produced using a crystalline silicon film formed by the present invention. FIGS. 3A to 3F show a forming process of the embodiment.

Figure 3A:
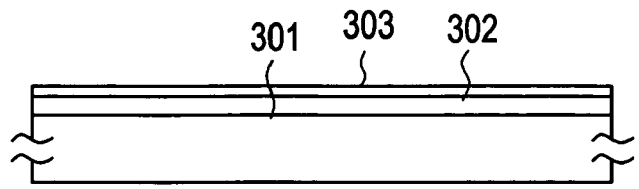
FIGS. 3A to 3F show a producing process of a TFT of an embodiment.

A silicon oxide film 302 having a thickness of 2000 Å is formed as a base film on a glass substrate 301, to prevent impurity diffusion from the glass substrate 301. An amorphous silicon film having a thickness of 500 Å is formed by a method similar to EMBODIMENT 1. (FIG. 3A)

Figure 3B:
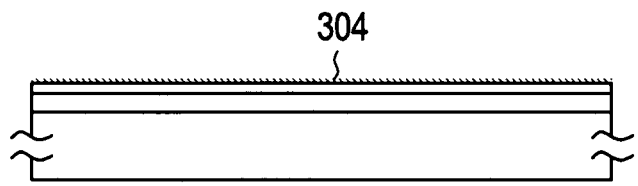

As similar to EMBODIMENT 1, a nickel compound film 304 is deposited on a surface of the amorphous silicon film by thermal composing method with an organic nickel vapor. (FIG. 3B)

Figure 3C:
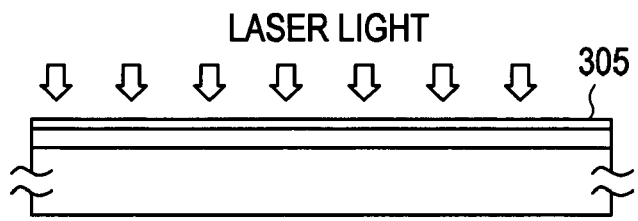

An amorphous silicon film 303 is crystallized by thermal annealing at 550° C. for 4 hours, so that a crystalline silicon film 305 is obtained. A KrF excimer laser light (wavelength of 248 nm) is irradiated to the film 305, to improve crystallization. It is preferred that an energy density of the laser is 300 to 350 mJ/cm$^2$. As described above, in addition to crystallization by a solid phase growth, crystallinity is further increased by laser irradiation. As described in EMBODIMENT 5, this is because, since crystallization in a region in which a nickel compound film is in contact with an amorphous silicon film is not aligned at a desired direction, crystallinity is not superior or not high. In particular, a lot of amorphous remainders are observed in a crystal grain boundary. Therefore, it is desired that amorphous components in the crystal grain boundary are completely crystallized by laser irradiation. (FIG. 3C)

Figure 3D:
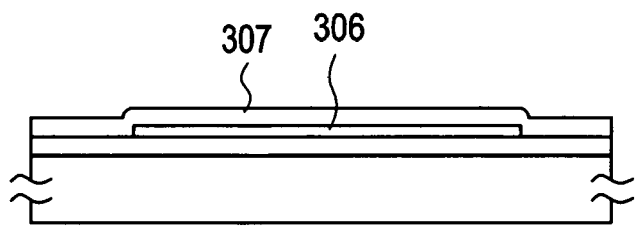

The crystallized silicon film is patterned to form an island region 306 constructing an active layer of a TFT. A silicon oxide film 307 having a thickness of 200 to 1500 Å, 1000 Å in the embodiment, is deposited as a gate insulating film by plasma CVD. (FIG. 3D)

It is necessary to pay attention to formation of the silicon oxide film 307. Tetra-ethyl-ortho-silicate (TEOS) as a raw with oxygen is decomposed by RF plasma CVD at a substrate temperature of 150 to 600° C., preferably 300 to 450° C. and then a film is deposited. A pressure ratio between the TEOS and the oxygen is 1:1 to 1:3. A pressure is 0.05 to 0.5 torr. An RF power is 100 to 250 W. Or TEOS as a raw with an ozone gas is decomposed by LPCVD or atmosphere pressure CVD at a substrate temperature of 350 to 600° C., preferably 400 to 550° C. and then a film is formed. After film formation, annealing may be performed in an atmosphere containing oxygen or ozone at 400 to 600° C. for 30 to 60 minutes.

Figure 3E:
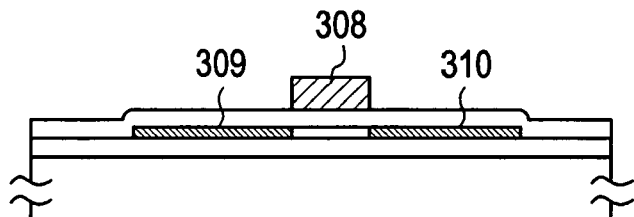

A phosphorus-doped polycrystalline silicon film having a thickness of 2000 Å to 1 μm is formed by LPCVD and then patterned to form a gate electrode 308. By ion doping (plasma doping), an impurity (phosphorus) is implanted into an island silicon film of a TFT using the gate electrode 308 as a mask in a self-alignment. A doping gas is phosphine (PH$_3$). A dose is $1\times10^{14}$ to $4\times10^{15}$ cm$^{-2}$. As a result, N-type impurity (phosphorus) regions 309 and 310 are formed. (FIG. 3E)

A silicon oxide film having a thickness of 3000 to 8000 Å is formed as an interlayer insulator 311 on a whole by plasma CVD having TEOS as a raw with oxygen, or by LPCVD (or atmosphere pressure CVD) having TEOS with ozone. A substrate temperature is 250 to 450° C., for example, 350° C. After film formation, in order to planerize a film surface, the silicon oxide film may be mechanically polished or may be etched back. The interlayer insulator 311 is etched to form contact holes in source and drain regions of a TFT, and then wiring-electrodes 312 and 313 of chromium or titanium nitride are formed.

Figure 3F:
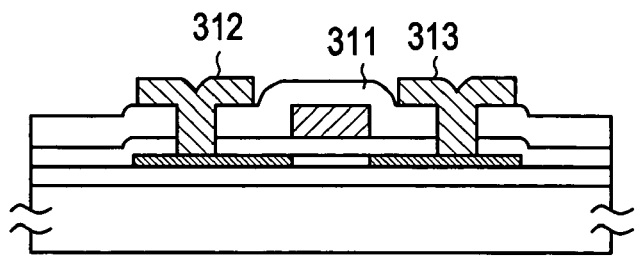

Annealing is completed in an atmosphere containing hydrogen at 300 to 400° C. for 0.1 to 2 hours, so that hydrogenation of silicon is completed. As a result, a TFT is produced. By producing a lot of TFTs and arranging them in a matrix form, an integrated circuit for an active matrix type liquid crystal display device or the like may be formed. (FIG. 3F)

Embodiment 7

The embodiment relates to a producing process of a TFT. FIGS. 4A to 4F show a producing process of the embodiment.

Figure 4A:
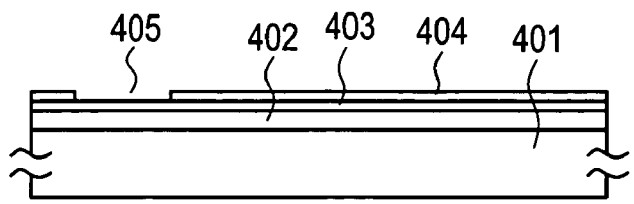
FIGS. 4A to 4F show a producing process of a TFT of another embodiment.

A silicon oxide film 402 having a thickness of 2000 Å is formed as a base film on a glass substrate 401. An amorphous silicon film 403 having a thickness of 500 Å is formed on the film 402. A silicon oxide film 404 having a thickness of 1000 Å is formed as a mask film on the film 403. A window region 405 is selectively formed in the mask film 404. (FIG. 4A)

Figure 4B:
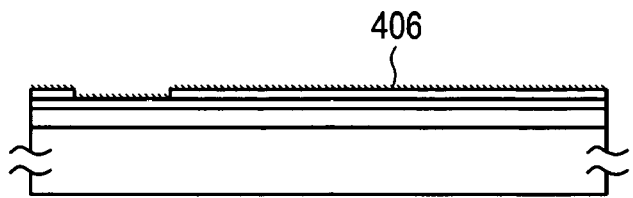

As similar to EMBODIMENT 1, a nickel compound film 406 is deposited by a thermal decomposing method with an organic nickel vapor. In this process, the nickel compound film 406 is in contact with (adhered to) a surface of the amorphous silicon film 403 in the window region 405. (FIG. 4B)

Figure 4C:
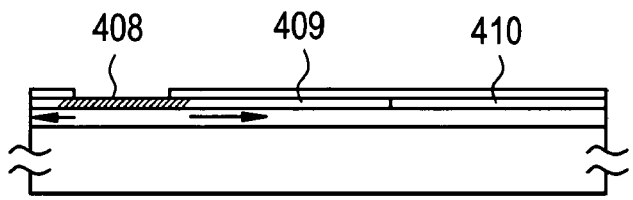

Thermal annealing is performed at 550° C. for 8 hours to crystallize the amorphous silicon film 403 along a transverse direction as shown in arrows, so that a longitudinal growth region 408 and a transverse growth region 409 are formed. A region in which is not crystallized in this process remains as an amorphous region 410. (FIG. 4C)

In the embodiment, since crystallinity of a transverse growth region is superior or high in crystallization with a transverse direction, as shown in EMBODIMENT 6, TFT can be produced without irradiating a laser light or the like to improve crystallinity. Therefore, the laser light is not irradiated in the embodiment. However, a TFT having further improved characteristics can be obtained by irradiating the laser light.

The crystallized silicon film is patterned to form an island region 411 constructing an active layer of a TFT. The island region 411 includes the longitudinal growth region 408, the transverse growth region 409 and the amorphous region 410. In the embodiment, a channel region of a TFT becomes the transverse growth region 409. This is because the channel region is an important portion with respect to characteristics of a TFT.

Figure 4D:
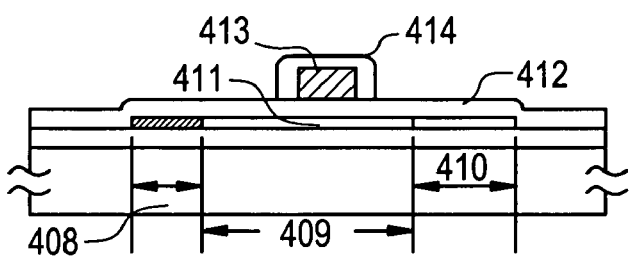

A silicon oxide film 412 is deposited as a gate insulating film, and then an aluminum film having a thickness of 2000 Å to 1 μm is formed by sputtering and patterned to form a gate electrode 413. Scandium (Sc) at 0.15 to 0.2 weight % may be doped into the aluminum film. A substrate is immersed into an ethylene glycol solution containing a tartaric acid of 1 to 3% (pH is about 7) and then anodization is performed using platinum as a cathode and the aluminum gate electrode as an anode. In anodization, a voltage is increased until 220 V while a constant current is supplied, this state is maintained for 1 hour. In a constant current state, it is desired that an increase speed of a voltage is 2 to 5 V/minute. As a result, an anodic oxide 414 having a thickness of 1500 to 3500 Å, for example, 2000 Å, is formed on upper and side surfaces of the gate electrode 413. (FIG. 4D)

By ion doping (plasma doping), an impurity (phosphorus) is implanted into an island silicon film of each TFT using a gate electrode portion as a mask in a self-alignment. The doping gas is phosphine ($PH_3$). A dose is $1\times10^{14}$ to $4\times10^{15}$ $cm^{-2}$. In this doping process, since the anodic oxide 414 is formed, an offset state which impurity regions 415 and 416 do not overlap with (are spaced apart from) the gate electrode is obtained.

Figure 4E:
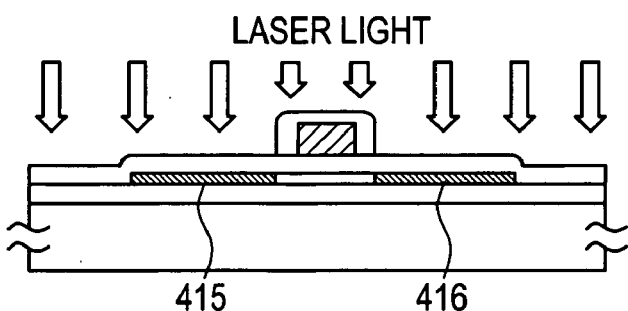

A KrF excimer laser (wavelength of 248 nm and a pulse width of 20 ns) is irradiated to improve (increase) crystallinity in a portion which crystallinity is decreased by impurity introduction. An energy density of the laser is 150 to 400 $mJ/cm^2$, preferably, 200 to 250 $mJ/cm^2$. As a result, N-type impurity (phosphorus) regions 415 and 416 are formed. A sheet resistance of these regions is 200 to 800 Ω/square. By this laser irradiation process, the amorphous region 410 in the island silicon region 411 is also crystallized. (FIG. 4E)

In this process, using a flash lamp instead of a laser, a temperature may increased until a silicon monitor temperature of 1000 to 1200° C. for a short time, to heat an object. This is called a rapid thermal annealing (RTA) or a rapid thermal process (RTP).

Figure 4F:
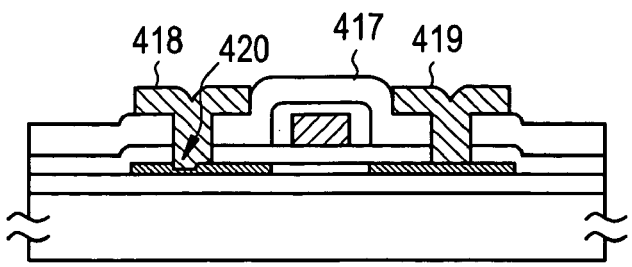

A silicon oxide film 417 having a thickness of 5000 Å is deposited on a whole and etched by using a buffer hydrofluoric acid solution to form contact holes in source and drain regions of a TFT, and then wiring-electrodes 418 and 419 of a multilayer film having titanium nitride and aluminum are formed. In an etching process for contact holes, since a longitudinal growth region in an island silicon region has a higher etching rate than a transverse growth region and an amorphous region, a deep etched region 420 is formed. If a whole contact hole is included in the longitudinal growth region, a contact defect produces easily. Therefore, it is desired to form a contact hole so as to overlap with a region other than the longitudinal growth region. As a result, a TFT is completed (FIG. 4F)

When, as a method for introducing a catalytic element which promotes crystallization of an amorphous silicon film, a method for depositing on an amorphous silicon film a film obtained by decomposing a vapor or a gas of an organic compound having a catalytic element is used, as described above, a concentration of a catalytic element can be adjusted precisely and further uniform addition can be performed, thereby to improve uniformity of crystallinity. As a result, an electric device having high reliability using a crystalline silicon film can be provided.

What is claimed is:
1. A method of manufacturing a semiconductor device comprising the steps of:
   forming a semiconductor film comprising amorphous silicon on an insulating surface;
   forming a crystallization promoting material comprising a metal in contact with said semiconductor film in a chamber; and
   crystallizing said semiconductor film in contact with said crystallization promoting material in said chamber,
   wherein the step of crystallizing said semiconductor film is carried out successively after the formation of said crystallization promoting material without exposing said semiconductor film and said crystallization promoting material to the air outside said chamber.

2. The method according to claim 1 wherein said metal is selected from the group consisting of Ni, Pd, Pt, Cu, Ag, Au, In, Sn, and Sb.

3. The method according to claim 1 further comprising a step of patterning the crystallized semiconductor film to form an active layer of a thin film transistor.

4. A method of manufacturing a semiconductor device comprising the steps of:
forming a semiconductor film comprising amorphous silicon on an insulating surface;
forming a crystallization promoting material comprising a metal in contact with said semiconductor film; and
crystallizing said semiconductor film by heating said semiconductor film;
wherein the step of forming the crystallization promoting material and the step of crystallizing said semiconductor film are conducted successively in a same chamber without exposing said semiconductor film and said crystallization promoting material to the air outside said chamber.

5. The method according to claim 4 wherein said metal is selected from the group consisting of Ni, Pd, Pt, Cu, Ag, Au, In, Sn, and Sb.

6. The method according to claim 4 further comprising a step of patterning the crystallized semiconductor film to form an active layer of a thin film transistor.

7. A method of manufacturing a semiconductor device comprising the steps of:
forming a semiconductor film comprising amorphous silicon on an insulating surface;
forming a crystallization promoting material comprising a metal in contact with said semiconductor film by using a vapor of a gas containing said metal in a chamber; and
crystallizing said semiconductor film in contact with said crystallization promoting material in said chamber,
wherein the step of crystallizing said semiconductor film is carried out successively after the formation of said crystallization promoting material without exposing said semiconductor film and said crystallization promoting material to the air outside said chamber.

8. The method according to claim 7 wherein said metal is selected from the group consisting of Ni, Pd, Pt, Cu, Ag, Au, In, Sn, and Sb.

9. The method according to claim 7 further comprising a step of patterning the crystallized semiconductor film to form an active layer of a thin film transistor.

10. A method of manufacturing a semiconductor device comprising the steps of:
forming a semiconductor film comprising amorphous silicon on an insulating surface;
forming a crystallization promoting material comprising a metal in contact with a selected portion of said semiconductor film in a chamber; and
crystallizing said semiconductor film in contact with said crystallization promoting material in said chamber,
wherein the step of crystallizing said semiconductor film is carried out successively after the formation of said crystallization promoting material without exposing said semiconductor film and said crystallization promoting material to the air outside said chamber.

11. The method according to claim 10 wherein said metal is selected from the group consisting of Ni, Pd, Pt, Cu, Ag, Au, In, Sn, and Sb.

12. The method according to claim 10 further comprising a step of patterning the crystallized semiconductor film to form an active layer of a thin film transistor.

13. A method of manufacturing a semiconductor device comprising the steps of:
forming a semiconductor film comprising amorphous silicon on an insulating surface;
forming a crystallization promoting material comprising a metal in contact with a selected portion of said semiconductor film; and
crystallizing said semiconductor film by heating said semiconductor film;
wherein the step of forming the crystallization promoting material and the step of crystallizing said semiconductor film are conducted successively in a same chamber without exposing said semiconductor film and said crystallization promoting material to the air outside said chamber.

14. The method according to claim 13 wherein said metal is selected from the group consisting of Ni, Pd, Pt, Cu, Ag, Au, In, Sn, an Sb.

15. The method according to claim 13 further comprising a step of patterning the crystallized semiconductor film to form an active layer of a thin film transistor.

16. A method of manufacturing a semiconductor device comprising the steps of:
forming a semiconductor film comprising amorphous silicon on an insulating surface;
forming a crystallization promoting material comprising a metal in contact with a selected portion of said semiconductor film by using a vapor of a gas containing said metal in a chamber; and
crystallizing said semiconductor film in contact with said crystallization promoting material in said chamber,
wherein the step of crystallizing said semiconductor film is carried out successively after the formation of said crystallization promoting material without exposing said semiconductor film and said crystallization promoting material to the air outside said chamber.

17. The method according to claim 16 wherein said metal is selected from the group consisting of Ni, Pd, Pt, Cu, Ag, Au, In, Sn, and Sb.

18. The method according to claim 16 further comprising a step of patterning the crystallized semiconductor film to form an active layer of a thin film transistor.

* * * * *